United States Patent
Wang

(10) Patent No.: US 7,024,334 B2
(45) Date of Patent: Apr. 4, 2006

(54) METHOD AND SYSTEM FOR YIELD SIMILARITY OF SEMICONDUCTOR DEVICES

(75) Inventor: Eugene Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/881,739

(22) Filed: Jun. 29, 2004

(65) Prior Publication Data
US 2005/0278140 A1    Dec. 15, 2005

(30) Foreign Application Priority Data
Jun. 14, 2004    (CN) .................. 200410025413 A

(51) Int. Cl.
G06F 101/14    (2006.01)
G06F 19/00    (2006.01)
(52) U.S. Cl. .................. 702/179; 702/84; 700/121
(58) Field of Classification Search ................ 702/179, 702/182, 84, 81, 82; 257/E21.521, E21.525; 700/121; 438/14
See application file for complete search history.

(56) References Cited
U.S. PATENT DOCUMENTS
2003/0061212 A1* 3/2003 Smith et al. .................. 707/6
2003/0229462 A1  12/2003 Wang OTHER PUBLICATIONS
Wang, "Sameness-An Equivalency Index of Products, Processes and Services," 2002 Hawaii International Conference on Statistics, Jun. 5-9, 2002, 5 pages total.

* cited by examiner

Primary Examiner—John Barlow
Assistant Examiner—Meagan S Walling
(74) Attorney, Agent, or Firm—Townsend and Townsend and Crew LLP

(57) ABSTRACT

A method and system for yield similarity of semiconductor devices. The method includes providing a first plurality of semiconductor devices, providing a second plurality of semiconductor devices, obtaining a first plurality of yields associated with a first yield, and obtaining a second plurality of yields associated with a second yield. Additionally, the method includes performing a first statistical analysis for the first plurality of yields, determining a first statistical distribution, performing a second statistical analysis for the second plurality of yields, and determining a second statistical distribution. Moreover, the method includes processing information associated with the first statistical distribution and the second statistical distribution, and determining an indicator. Also, the method includes processing information associated with the indicator, determining a confidence level, processing information associated with the confidence level, and determining whether the first yield and the second yield are similar.

20 Claims, 2 Drawing Sheets

FIG. 2

METHOD AND SYSTEM FOR YIELD SIMILARITY OF SEMICONDUCTOR DEVICES

CROSS-REFERENCES TO RELATED APPLICATIONS

This application claims priority to Chinese Patent Application No. 200410025413.1, filed Jun. 14, 2004, entitled "Method and System for Yield Similarity of Semiconductor Devices," by Inventor Eugene Wang, commonly assigned, incorporated by reference herein for all purposes.

The following three commonly-owned co-pending applications, including this one, are being filed concurrently and the other two are hereby incorporated by reference in their entirety for all purposes:

1. U.S. patent application Ser. No. 10/880,761, in the name of Eugene Wang and Jinghua Ni, titled, "Method and System for Processing Stability of Semiconductor Devices,"
2. U.S. patent application Ser. No. 10/882,081, in the name of Eugene Wang and Jinghua Ni, titled, "Method and System for Processing Commonality of Semiconductor Devices"; and
3. U.S. patent application Ser. No. 10/881,739, in the name of Eugene Wang, titled, "Method and System for Yield Similarity of Semiconductor Devices".

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits and their processing for the manufacture of semiconductor devices. More particularly, the invention provides a method and system for processing similarity of the manufacture of integrated circuits. Merely by way of example, the invention has been applied to yield of semiconductor devices. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is yield similarity of semiconductor devices between different production lines or different production sites.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, a chip company usually utilizes several separate manufacturing sites. To flexibly use the capacity at each site, the company may distribute a single large order to several sites which may simultaneously manufacture the same kind of product. Additionally, to avoid any supply discontinuity caused by an unexpected accident in a manufacturing process, customers may request their products being qualified and manufactured on several lines or at several sites. If one site experiences certain problems, the loading can be immediately moved to other sites. Therefore the risk to the customers in supply lines is significantly reduced. Although the various production sites are usually built at different periods of time, and the tools equipped may be different from each other, the final products from different sites should bear similar yields. These and other limitations are described throughout the present specification and more particularly below.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method and system for processing similarity of the manufacture of integrated circuits. Merely by way of example, the invention has been applied to yield of semiconductor devices. But it would be recognized that the invention has a much broader range of applicability.

In a specific embodiment, the invention provides a method for yield similarity of semiconductor devices. The method includes providing a first plurality of semiconductor devices, providing a second plurality of semiconductor devices, obtaining a first plurality of yields associated with a first yield related to the first plurality of semiconductor devices, and obtaining a second plurality of yields associated with a second yield related to the second plurality of semiconductor devices. Additionally, the method includes performing a first statistical analysis for the first plurality of yields, determining a first statistical distribution based on at least information associated with the first statistical analysis, performing a second statistical analysis for the second plurality of yields, and determining a second statistical distribution based on at least information associated with the second statistical analysis. Moreover, the method includes processing information associated with the first statistical distribution and the second statistical distribution, and determining an indicator based on at least information associated with the first statistical distribution and the second statistical distribution. The indicator is associated with an overlapping area between the first statistical distribution and the second statistical distribution. Also, the method includes processing information associated with the indicator, determining a confidence level based on at least information associated with the indicator, processing information associated with the confidence level, and determining whether the first yield and the second yield are similar based on at least information associated with the confidence level. The confidence level is associated with a second order of the indicator and a first order of the indicator. The determining whether the first yield and the second yield are similar includes if the confidence level is equal to or higher than 95%, determining the first yield and the second yield to be similar, and if the confidence level is lower than 95%, determining the first yield and the second yield to be not similar.

According to another embodiment, a computer-readable medium including instructions for yield similarity of semiconductor devices. The computer-readable medium includes one or more instructions for receiving a first plurality of yields associated with a first yield related to a first plurality of semiconductor devices, one or more instructions for receiving a second plurality of yields associated with a second yield related to a second plurality of semiconductor devices, one or more instructions for performing a first statistical analysis for the first plurality of yields, and one or more instructions for determining a first statistical distribution based on at least information associated with the first statistical analysis. Additionally, the computer-readable medium includes one or more instructions for performing a second statistical analysis for the second plurality of yields, one or more instructions for determining a second statistical distribution based on at least information associated with the second statistical analysis, one or more instructions for processing information associated with the first statistical distribution and the second statistical distribution, and one or more instructions for determining an indicator based on at least information associated with the first statistical distribution and the second statistical distribution. The indicator is associated with an overlapping area between the first statistical distribution and the second statistical distribution. Moreover, the computer-readable medium includes one or more instructions for processing information associated with the indicator, one or more instructions for determining a confidence level based on at least information associated with the indicator, one or more instructions for processing information associated with the confidence level, and one or more instructions for determining whether the first yield and the second yield are similar based on at least information associated with the confidence level. The confidence level is associated with a second order of the indicator and a first order of the indicator. The one or more instructions for determining whether the first yield and the second yield are similar includes one or more instructions for if the confidence level is equal to or higher than 95%, determining the first yield and the second yield to be similar, and one or more instructions for if the confidence level is lower than 95%, determining the first yield and the second yield to be not similar.

For example, the confidence level is equal to a percentage number associated with a sum of the second order of the indicator multiplied by −0.56 and the first order of the indicator multiplied by 1.56. The one or more instructions for determining whether the first yield and the second yield are similar further comprises one or more instructions for if the confidence level is equal to or higher than 99%, determining the first yield and the second yield to be highly similar. In another example, the indicator is dependent upon only a first statistical parameter and a second statistical parameter. The one or more instructions for determining a confidence level includes one or more instructions for obtaining the confidence level from a table. The table provides the confidence level as a function of the first statistical parameter and the second statistical parameter. In yet another example, the first statistical distribution is associated with a first binomial distribution related to a first average yield and a first number, and a second statistical distribution is associated with a second binomial distribution related to a second average yield and a second number. The first binomial distribution is approximately equal to a first normal distribution associated with a first mean and a first standard deviation, and the second binomial distribution is approximately equal to a second normal distribution associated with a second mean and a second standard deviation. The indicator is dependent upon only a first statistical parameter and a second statistical parameter. The first statistical parameter is proportional to a difference between the first mean and the second mean, and the second statistical parameter is associated with a ratio between the first standard deviation and the second standard deviation. In yet another example, the first plurality of semiconductor devices is associated with a first production site, and the second plurality of semiconductor devices is associated with a second production site.

Many benefits are achieved by way of the present invention over conventional techniques. For example, the present technique provides an easy to use process that relies upon conventional technology. In some embodiments, the method provides reliable determination of yield similarity between different production lines or different production sites. For example, the yield similarity is assessed between a baseline process and a non-baseline process. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

Figure 2:
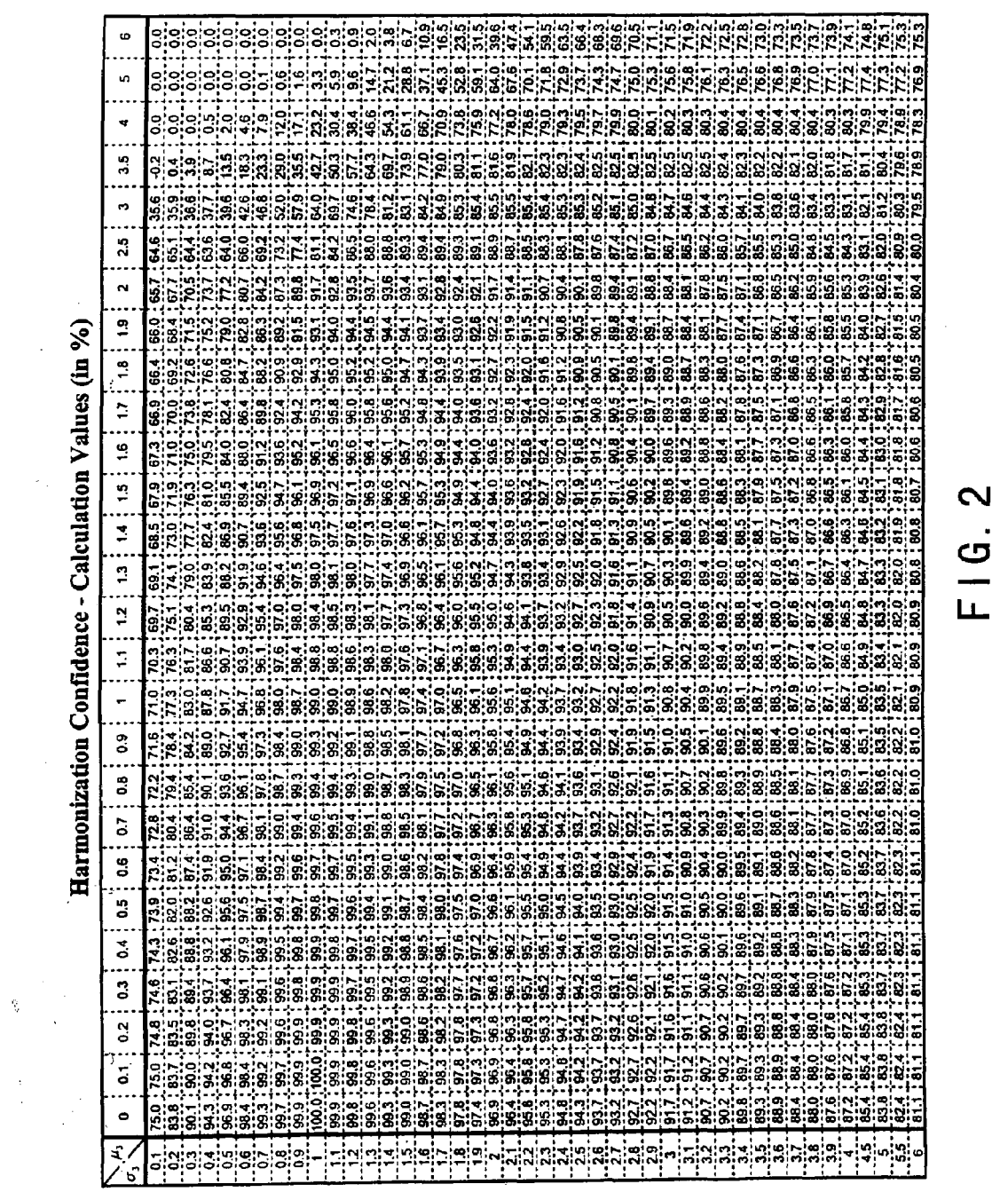

FIG. 2 is a simplified harmonization confidence as a function of two statistical parameters.

DETAILED DESCRIPTION OF THE INVENTION

Figure 1:
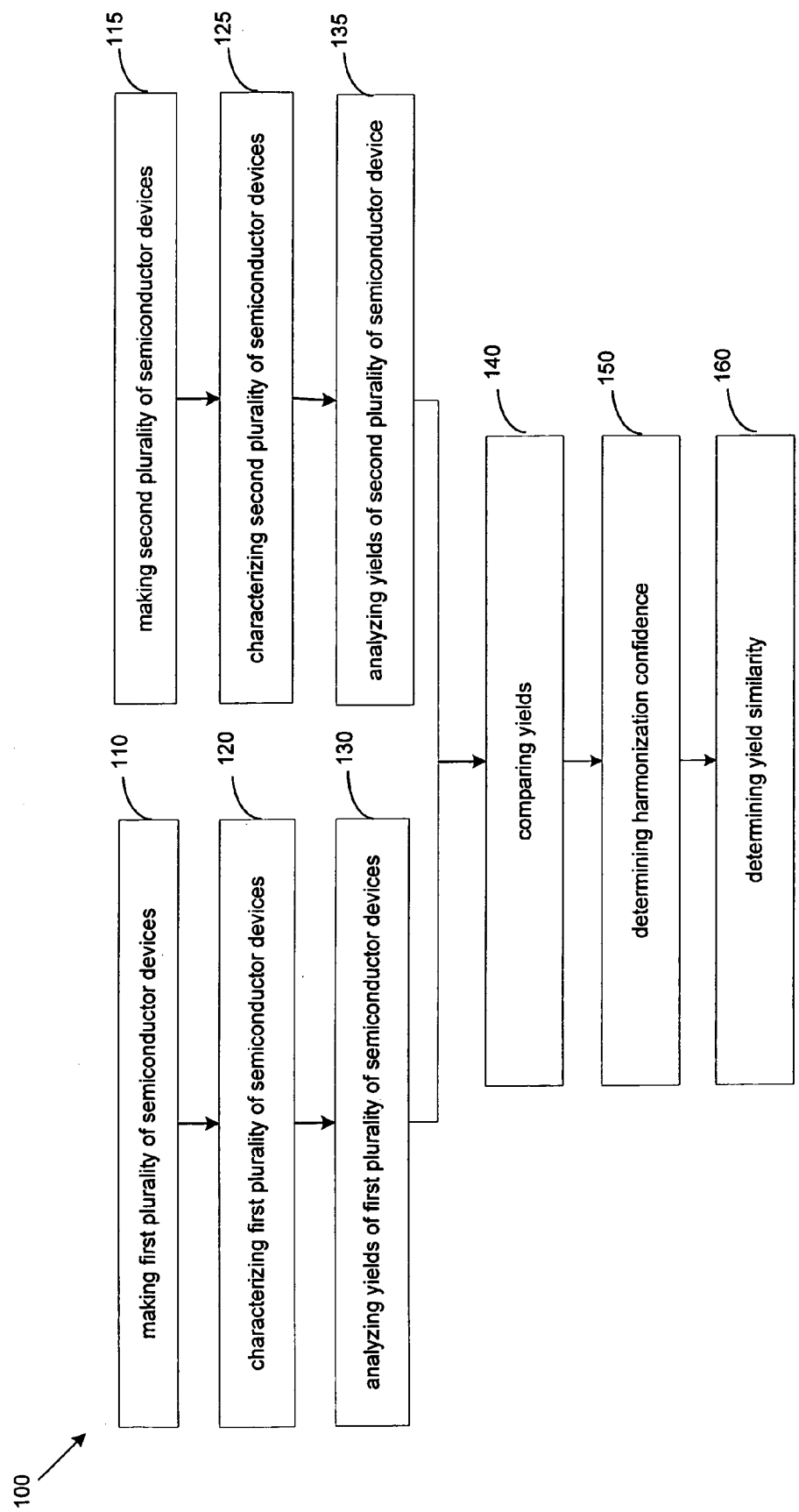
FIG. 1 is a simplified method for yield similarity of semiconductor manufacture according to an embodiment of the present invention

The present invention is directed to integrated circuits and their processing for the manufacture of semiconductor devices. More particularly, the invention provides a method and system for processing similarity of the manufacture of integrated circuits. Merely by way of example, the invention has been applied to yield of semiconductor devices. But it would be recognized that the invention has a much broader range of applicability.

FIG. 1 is a simplified method for yield similarity of semiconductor manufacture according to an embodiment of the present invention. This diagram is merely an example, which should not unduly limit the scope of the claims herein. The method 100 includes the following processes:

1. Process 110 for making first plurality of semiconductor devices;
2. Process 115 for making second plurality of semiconductor devices;
3. Process 120 for characterizing first plurality of semiconductor devices;
4. Process 125 for characterizing second plurality of semiconductor devices;
5. Process 130 for analyzing yields of first plurality of semiconductor devices;
6. Process 135 for analyzing yields of second plurality of semiconductor devices;
7. Process 140 for comparing yields;
8. Process 150 for determining harmonization confidence;
9. Process 160 for determining yield similarity.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

At the process 10, a first plurality of semiconductor devices is fabricated. The semiconductor devices may include various types of transistors, diodes, resistors, inductors, or others. Additionally, the semiconductor devices may include starting products or intermediate products of transistors, diodes, resistors, inductors, or others. In one embodiment, the fabrication of a transistor starts with a starting product and includes various processing steps. For example, the starting product includes a semiconductor substrate. The semiconductor may be silicon, germanium, gallium arsenide, or other material. The processing steps may include deposition, anneal, ion implantation, etching, or other. After each processing step, the resulting structure is an intermediate product.

At the process 115, a second plurality of semiconductor devices is fabricated. By design, the second plurality of semiconductor devices has at least one characteristic the same as the first plurality of semiconductor devices. In one embodiment, the characteristic is an in-line process parameter. For example, the characteristic is width of polysilicon layer, deposition thickness, or metal critical dimension. In another embodiment, the characteristic is a device or wafer acceptance parameter. For example, the characteristic is sheet resistance or breakdown voltage. In yet another embodiment, the second plurality of semiconductor devices has the same structural and functional specifications as the first plurality of semiconductor devices. For example, the second plurality of semiconductor devices by design are made with starting structures and fabrication processes the same as ones for the first plurality of semiconductor devices.

Additionally, the first plurality of semiconductor devices is made on a first production line or at a first production site, and the second plurality of semiconductor devices is made on a second production line or at a second production site. For example, the first production line and the second production line are within the same production site or belong to different production sites. In one embodiment, the first production line and the second production line share at least some fabrication tools. In another embodiment, the first production line and the second production line do not share any fabrication tool. In yet another embodiment, the first production site and the second production site both use certain types of fabrication tools. For example, an anneal chamber used at the first production site has a model number that is the same as at the second production site. In yet another embodiment, the first production site and the second production site do not both use any same type of fabrication tool. For example, an anneal chamber used at the first production site is made by a manufacturer different from one at the second production site.

Moreover, the first production line or the first production site provides a based line fabrication process according to an embodiment of the present invention. For example, a company may design and qualify a new product at its research and development center and then fan out the new product into several manufacturing sites for mass production. The performance record at the research and development center is the baseline. In another example, the company chooses a baseline site with best performance among several production sites.

Also, in another embodiment, a company harmonizes different manufacturing sites. For example, a control board is established for leading the task. Starting from unifying nomenclature rules, all sites use a common process flow when manufacturing a same specific product. The differences in tools at different sites are analyzed and reduced before, after, or during the method 100 is performed.

At the process 120, the first plurality of semiconductor devices is characterized. In one embodiment, one structural or functional parameter is measured for some or all of the first plurality of semiconductor devices. For example, the structural parameter is a dimension of a deposited layer, such as width of polysilicon layer, deposition thickness, or metal critical dimension. In another example, the structural parameter is a doping profile, a mobility profile, a stress profile, or other. In yet another embodiment, the function parameter is sheet resistance, turn-on voltage, breakdown voltage, leakage current, or other. In another embodiment, more than one structural or functional parameter is measured for some or all of the first plurality of semiconductor devices. In yet another embodiment, one or more parameters associated with the first plurality of semiconductor devices including or other than one or more structural and function parameters are measured for some or all of the first plurality of semiconductor devices.

Additionally, as discussed above, some or all of the first plurality of semiconductor devices are characterized. In one embodiment, the first plurality of semiconductor devices is fabricated on a first plurality of semiconductor wafers. Each plurality of semiconductor wafers includes n semiconductor devices, where n is a positive integer. For example, each semiconductor device corresponds to a die on a semiconductor wafer. From the first plurality of semiconductor wafers, $m_A$ wafers are selected for characterization. $m_A$ is a positive integer. The selection of $m_A$ wafers is random or based on a first predetermined condition.

In one embodiment, the one or more parameters measured for some or all of the first plurality of semiconductor devices are compared with a first requirement. If the requirement is satisfied, the semiconductor device is considered satisfactory. If the requirement is not satisfied, the semiconductor device is considered unsatisfactory. The yield, i.e., ratio of satisfactory devices to all devices tested, is $p_{Ai}$ for each wafer, where i=1, 2, ..., $m_A$. The average yield for the corresponding production line or production site is $$\overline{p}_A = \frac{1}{m_A} \sum_{i=1}^{m_A} p_{Ai}.$$

At the process 125, the second plurality of semiconductor devices is characterized. One or more parameters determined for the first plurality of semiconductor devices are also measured for some or all of the first plurality of semiconductor devices. According to one embodiment, some or all of the second plurality of semiconductor devices are characterized. In one embodiment, the second plurality of semiconductor devices is fabricated on a second plurality of semiconductor wafers. Each plurality of semiconductor wafers includes n semiconductor devices, where n is a positive integer. For example, each semiconductor device corresponds to a die on a semiconductor wafer. From the first plurality of semiconductor wafers, $m_B$ wafers are selected for characterization. $m_B$ is a positive integer. The selection of $m_B$ wafers is random or based on a second predetermined condition. For example, the second predetermined condition may be the same or different from the first predetermined condition.

In one embodiment, the one or more parameters measured for some or all of the second plurality of semiconductor devices are compared with a second requirement. If the second requirement is satisfied, the semiconductor device is considered satisfactory. If the second requirement is not satisfied, the semiconductor device is considered unsatisfactory. The yield, i.e., ratio of satisfactory devices to all devices tested, is $p_{Bi}$ for each wafer, where i=1, 2, ..., $m_B$. The average yield for the corresponding production line or production site is $$\overline{p}_B = \frac{1}{m_B} \sum_{i=1}^{m_B} p_{Bi}.$$

In none embodiment, the first requirement and the second requirement are the same. In another embodiment, the first requirement and the second requirement are different.

At the process 130, the yields of the first plurality of semiconductor devices are analyzed. For example, the yields $p_{Ai}$ for $m_A$ wafers can be modeled statistically by at least a Binomial distribution. The mean of the Binomial (n; $\overline{p}_A$) distribution is $n\overline{p}_A$. The variance of the Binomial (n; $\overline{p}_A$) distribution is $n\overline{p}_A(1-\overline{p}_A)$. For example, $n\overline{p}_A \geq 5$ and $n(1-\overline{p}_A) \geq 5$. The Binomial (n; $\overline{p}_A$) distribution can be approximated to a Normal distribution N ($n\overline{p}_A$, $n\overline{p}_A(1-\overline{p}_A)$), with $\mu_1 = n\overline{p}_A$ and $$\sigma_1 = \sqrt{n\overline{p}_A(1-\overline{p}_A)}.$$

$\mu_1$ is a mean parameter and $\sigma_1$ is a standard deviation parameter. In another example, the yields are analyzed with a statistical model other than the binomial distribution or the normal distribution.

At the process 135, the yields of the second plurality of semiconductor devices are analyzed. For example, the yields $p_{Bi}$ for $m_B$ wafers can be modeled statistically by at least a Binomial distribution. The mean of the Binomial (n; $\overline{p}_B$) distribution is $n\overline{p}_B$. The variance of the Binomial (n; $\overline{p}_B$) distribution is $n\overline{p}_B(1-\overline{p}_B)$ For example, $n\overline{p}_B \geq 5$ and $n(1-\overline{p}_B) \geq 5$. The Binomial (n; $\overline{p}_B$) distribution can be approximated to a Normal distribution N ($n\overline{p}_B$, $n\overline{p}_B(1-\overline{p}_B)$), with $\mu_2 = n\overline{p}_B$ and $$\sigma_2 = \sqrt{n\overline{p}_B(1-\overline{p}_B)}.$$

$\mu_2$ is a mean parameter and $\sigma_2$ is a standard deviation parameter. In another example, the yields are analyzed with a statistical model other than the binomial distribution or the normal distribution.

At the process 140, the yields of the first plurality of semiconductor devices and the second plurality of semiconductor devices are compared. In one embodiment, the yields for the first plurality of semiconductor devices are modeled with at least $$N(\mu_1, \sigma_1^2),$$

and the yields for the second plurality of semiconductor devices are modeled with at least $$N(\mu_2, \sigma_2^2).$$

Through a mathematical transformation, the normal distribution for the first plurality of semiconductor devices is converted to a standard normal distribution N(0, 1). The standard normal distribution has a mean value of zero and a standard deviation parameter of one. The same mathematical transformation converts the normal distribution of the second plurality of semiconductor devices to another normal distribution $$N(\mu_3, \sigma_3^2),$$

where $$\mu_3 = \frac{1}{\sigma_1}(\mu_2 - \mu_1) = \frac{\sqrt{n}\,(\overline{p}_B - \overline{p}_A)}{\sqrt{\overline{p}_A(1-\overline{p}_A)}} \qquad \text{(Equation 1)}$$

$$\sigma_3 = \frac{\sigma_2}{\sigma_1} = \sqrt{\frac{\overline{p}_B(1-\overline{p}_B)}{\overline{p}_A(1-\overline{p}_A)}} \qquad \text{(Equation 2)}$$

According to one embodiment of the present invention, the yield comparison between the first plurality and the second plurality of semiconductor devices is measured by the overlapping area of the standard normal distribution N(0, 1) and $$N(\mu_3, \sigma_3^2)$$

between the interested interval CD. Specifically, the overlapping area is determined as follows:

$$A(\mu_3, \sigma_3) = \left(\frac{1}{2}\int_C^D \left[e^{-\frac{y^2}{2}} + \frac{1}{\sigma_3}e^{-\frac{(y-\mu_3)^2}{2\sigma_3^2}}\right]dy\right) \Big/ \int_{-3}^{3} e^{-\frac{y^2}{2}} dy \quad \text{(Equation 3)}$$

$$C = \max(-3, \mu_3 - 3\sigma_3) \quad \text{(Equation 4)}$$

$$D = \min(3, \mu_3 + 3\sigma_3) \quad \text{(Equation 5)}$$

At the process 150, harmonization confidence is determined. For example, the harmonization confidence is defined as follows.

$$HC1Y = (-0.56\,A^2 + 1.56\,A) \times 100\% \quad \text{(Equation 6)}$$

where HC1Y is the harmonization confidence in percentage. For example, if A is 0.8, HC1Y would equal 88.96%. According to one embodiment of the present invention, HC1Y is associated with the degree of yield similarity from the first production line or the first production site and from the second production line or the second production site. As shown in Equation 4, the harmonization confidence is a binary function of $\mu_3$ and $\sigma_3$. FIG. 2 is a simplified harmonization confidence as a function of $\mu_3$ and $\sigma_3$. This diagram is merely an example, which should not unduly limit the scope of the claims. One of ordinary skill in the art would recognize many variations, alternatives, and modifications. As shown in FIG. 2, $\mu_3$ varies from 0 to 6 in the rows and $\mu_3$ varies from 0.1 to 6 in the columns. The harmonization confidence is symmetric to 0 with respect to $\mu_3$, so the table also covers $\mu_3$ values ranging from 0 to −6. The process 150 may be performed by using the table in FIG. 2.

At the process 160, the yield similarity is determined based on the harmonization confidence. For example, if the harmonization confidence is higher than or equal to 95%, the yield is considered similar between different production lines or different production sites. In another example, if the harmonization confidence is higher than or equal to 99%, the yield is considered highly similar between different production lines or different production sites.

In semiconductor industry, the yield is an important factor of reliability. For example, a wafer with low yield implies a high risk in reliability. In one embodiment, if the yield is not considered to be similar, the yield may vary significantly from one production line to another production line, or from one production site to another production site. Such variation may have an adverse impact on system integration and limit the use of such product in critical applications. In yet another embodiment, if the yield is considered to be highly similar, the yield remains substantially the same among different production lines or different production sites. Such product may be preferred for critical applications.

As discussed above and further emphasized here, FIG. 1 is merely an example, which should not unduly limit the scope of the claims. One of ordinary skill in the art would recognize many variations, alternatives, and modifications.

In one embodiment, the product parameter measured and analyzed by the method 100 is any quality characteristic. For example, the product parameter is a physical characteristic, such as length, weight, pressure, voltage, current, or viscosity. In another example, the product parameter is a sensory characteristic, such as taste, color, or easiness of use. In yet another example, the product parameter is a time-dependant characteristic, such as reliability or durability. In another embodiment, the method 100 is applied to any product, not limited to semiconductor device.

In one embodiment of the present invention, some or all processes of the method 100 can be performed by a computer system. For example, a computer program product includes a computer-readable medium including instructions for yield similarity of semiconductor devices. The computer-readable medium includes one or receiving a first plurality of yields associated with a first yield related to a first plurality of semiconductor devices, one or more instructions for receiving a second plurality of yields associated with a second yield related to a second plurality of semiconductor devices, one or more instructions for performing a first statistical analysis for the first plurality of yields, and one or more instructions for determining a first statistical distribution based on at least information associated with the first statistical analysis. Additionally, the computer-readable medium includes one or more instructions for performing a second statistical analysis for the second plurality of yields, one or more instructions for determining a second statistical distribution based on at least information associated with the second statistical analysis, one or more instructions for processing information associated with the first statistical distribution and the second statistical distribution, and one or more instructions for determining an indicator based on at least information associated with the first statistical distribution and the second statistical distribution. The indicator is associated with an overlapping area between the first statistical distribution and the second statistical distribution. Moreover, the computer-readable medium includes one or more instructions for processing information associated with the indicator, one or more instructions for determining a confidence level based on at least information associated with the indicator, one or more instructions for processing information associated with the confidence level, and one or more instructions for determining whether the first yield and the second yield are similar based on at least information associated with the confidence level. The confidence level is associated with a second order of the indicator and a first order of the indicator. The one or more instructions for determining whether the first yield and the second yield are similar includes one or more instructions for if the confidence level is equal to or higher than 95%, determining the first yield and the second yield to be similar, and one or more instructions for if the confidence level is lower than 95%, determining the first yield and the second yield to be not similar.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for yield similarity of semiconductor devices, the method comprising:

providing a first plurality of semiconductor devices;

providing a second plurality of semiconductor devices;

obtaining a first plurality of yields associated with a first yield related to the first plurality of semiconductor devices;

obtaining a second plurality of yields associated with a second yield related to the second plurality of semiconductor devices;

performing a first statistical analysis for the first plurality of yields;

determining a first statistical distribution based on at least information associated with the first statistical analysis;

performing a second statistical analysis for the second plurality of yields;

determining a second statistical distribution based on at least information associated with the second statistical analysis;

processing information associated with the first statistical distribution and the second statistical distribution;

determining an indicator based on at least information associated with the first statistical distribution and the second statistical distribution, the indicator being associated with an overlapping area between the first statistical distribution and the second statistical distribution;

processing information associated with the indicator;

determining a confidence level based on at least information associated with the indicator;

processing information associated with the confidence level;

determining whether the first yield and the second yield are similar based on at least information associated with the confidence level;

wherein the confidence level is associated with a second order of the indicator and a first order of the indicator;

wherein the determining whether the first yield and the second yield are similar includes:

if the confidence level is equal to or higher than 95%, determining the first yield and the second yield to be similar;

if the confidence level is lower than 95%, determining the first yield and the second yield to be not similar.

2. The method of claim 1 wherein the confidence level is equal to a percentage number associated with a sum of the second order of the indicator multiplied by −0.56 and the first order of the indicator multiplied by 1.56.

3. The method of claim 2 wherein the determining whether the first yield and the second yield are similar further comprises if the confidence level is equal to or higher than 99%, determining the first yield and the second yield to be highly similar.

4. The method of claim 1 wherein the indicator is dependent upon only a first statistical parameter and a second statistical parameter.

5. The method of claim 4 wherein the determining a confidence level comprises:

obtaining the confidence level from a table;

wherein the table provides the confidence level as a function of the first statistical parameter and the second statistical parameter.

6. The method of claim 1 wherein the first statistical distribution is associated with a first binomial distribution related to a first average yield and a first number, and a second statistical distribution is associated with a second binomial distribution related to a second average yield and a second number.

7. The method of claim 6 wherein the first binomial distribution is approximately equal to a first normal distribution associated with a first mean and a first standard deviation, and the second binomial distribution is approximately equal to a second normal distribution associated with a second mean and a second standard deviation.

8. The method of claim 7 wherein the first mean is associated with the first average yield and the first number, and the first standard deviation is associated with the first average yield and the first number.

9. The method of claim 7 wherein the indicator is dependent upon only a first statistical parameter and a second statistical parameter, the first statistical parameter being proportional to a difference between the first mean and the second mean, the second statistical parameter being associated with a ratio between the first standard deviation and the second standard deviation.

10. The method of claim 6 wherein the first plurality of yields corresponds to a first plurality of wafers respectively, each of the first plurality of wafers including the first number of semiconductor devices.

11. The method of claim 1 wherein the first plurality of semiconductor devices is associated with a first production site, and the second plurality of semiconductor devices is associated with a second production site.

12. A computer-readable medium including instructions for yield similarity of semiconductor devices, the computer-readable medium comprising:

one or more instructions for receiving a first plurality of yields associated with a first yield related to a first plurality of semiconductor devices;

one or more instructions for receiving a second plurality of yields associated with a second yield related to a second plurality of semiconductor devices;

one or more instructions for performing a first statistical analysis for the first plurality of yields;

one or more instructions for determining a first statistical distribution based on at least information associated with the first statistical analysis;

one or more instructions for performing a second statistical analysis for the second plurality of yields;

one or more instructions for determining a second statistical distribution based on at least information associated with the second statistical analysis;

one or more instructions for processing information associated with the first statistical distribution and the second statistical distribution;

one or more instructions for determining an indicator based on at least information associated with the first statistical distribution and the second statistical distribution, the indicator being associated with an overlapping area between the first statistical distribution and the second statistical distribution;

one or more instructions for processing information associated with the indicator;

one or more instructions for determining a confidence level based on at least information associated with the indicator;

one or more instructions for processing information associated with the confidence level;

one or more instructions for determining whether the first yield and the second yield are similar based on at least information associated with the confidence level;

wherein the confidence level is associated with a second order of the indicator and a first order of the indicator;

wherein the one or more instructions for determining whether the first yield and the second yield are similar includes:

one or more instructions for if the confidence level is equal to or higher than 95%, determining the first yield and the second yield to be similar;

one or more instructions for if the confidence level is lower than 95%, determining the first yield and the second yield to be not similar.

13. The computer-readable medium of claim 12 wherein the confidence level is equal to a percentage number associated with a sum of the second order of the indicator multiplied by −0.56 and the first order of the indicator multiplied by 1.56.

14. The computer-readable medium of claim 13 wherein the one or more instructions for determining whether the first yield and the second yield are similar further comprises one or more instructions for if the confidence level is equal to or higher than 99%, determining the first yield and the second yield to be highly similar.

15. The computer-readable medium of claim 12 wherein the indicator is dependent upon only a first statistical parameter and a second statistical parameter.

16. The computer-readable medium of claim 15 wherein the one or more instructions for determining a confidence level comprises:

one or more instructions for obtaining the confidence level from a table;

wherein the table provides the confidence level as a function of the first statistical parameter and the second statistical parameter.

17. The computer-readable medium of claim 12 wherein the first statistical distribution is associated with a first binomial distribution related to a first average yield and a first number, and a second statistical distribution is associated with a second binomial distribution related to a second average yield and a second number.

18. The computer-readable medium of claim 17 wherein the first binomial distribution is approximately equal to a first normal distribution associated with a first mean and a first standard deviation, and the second binomial distribution is approximately equal to a second normal distribution associated with a second mean and a second standard deviation.

19. The computer-readable medium of claim 18 wherein the indicator is dependent upon only a first statistical parameter and a second statistical parameter, the first statistical parameter being proportional to a difference between the first mean and the second mean, the second statistical parameter being associated with a ratio between the first standard deviation and the second standard deviation.

20. The method of claim 12 wherein the first plurality of semiconductor devices is associated with a first production site, and the second plurality of semiconductor devices is associated with a second production site.

* * * * *